(12) United States Patent
Camin

(10) Patent No.: US 6,316,930 B1
(45) Date of Patent: Nov. 13, 2001

(54) DIRECT CURRENT METER WITH PASSIVE INPUT AND GALVANIC INSULATION, PARTICULARLY FOR HIGH VOLTAGE

(75) Inventor: Daniel V. Camin, Milan (IT)

(73) Assignee: Istito Nazionale di Fisica Nucleare, Frascati (IT)

(*) Notice: Subject to any disclaimer, the term of this patent is extended or adjusted under 35 U.S.C. 154(b) by 0 days.

(21) Appl. No.: 09/467,895

(22) Filed: Dec. 21, 1999

(30) Foreign Application Priority Data

Dec. 21, 1998 (IT) .............................................. MI98A2754

(51) Int. Cl.[7] .................................................. G01R 31/00
(52) U.S. Cl. ................................................. 324/97; 324/96
(58) Field of Search ............................... 324/97, 96, 126, 324/127

(56) References Cited

U.S. PATENT DOCUMENTS

| | | | |
|---|---|---|---|
| 3,772,514 | 11/1973 | Sunderland | 250/551 |
| 4,070,572 | 1/1978 | Summerhayes | 324/96 X |
| 4,316,141 * | 2/1982 | Adolfsson et al. | 324/96 |
| 5,107,202 * | 4/1992 | Renda | 324/96 |
| 5,389,578 * | 2/1995 | Hodson et al. | 437/209 |
| 5,654,559 * | 8/1997 | Spaeth et al. | 257/82 |
| 6,166,816 * | 12/2000 | Blake | 324/96 X |

OTHER PUBLICATIONS

Patent Abstracts of Japan, vol. 007, No. 051 (P–179), Feb. 26, 1983 & JP 57 199961 A (Mitsubishi Demki KK), Dec. 8, 1982.

* cited by examiner

Primary Examiner—Safet Metjahic
Assistant Examiner—T. R. Sundaram
(74) Attorney, Agent, or Firm—Nixon & Vanderhye, P.C.

(57) ABSTRACT

There is described a direct current meter with passive input and galvanic insulation, particularly for high voltage. The direct current meter is made up of a passive input part and of an active output part that is optically coupled to the passive part and electrically insulated from it. In this way the high voltage present at the input only affects the passive part of the meter, whereas the active part can be supplied with a low voltage and can be made capable to provide an output signal proportional to the current to be measured and substantially independent from the working temperature.

6 Claims, 1 Drawing Sheet

DIRECT CURRENT METER WITH PASSIVE INPUT AND GALVANIC INSULATION, PARTICULARLY FOR HIGH VOLTAGE

BACKGROUND

1. Field of the Invention

The present invention concerns a direct current meter with passive input and galvanic insulation, particularly for high voltage.

2. Prior Art and Other Considerations

The measurement of the intensity of a direct current that is produced by a high voltage source notoriety creates problems with insulation. This is the case, for instance, of the measurement of the anode current of a photomiltiplier tube with earthed cathode and anode supplied at high voltage.

An object of the present invention is provision of a direct current meter that is capable of measuring a direct current flowing in a conductor that is at high voltage, as for instance the anode voltage of a photomultiplier tube operating in the above indicated way.

SUMMARY

According to the invention such object is solved with a current meter characterized in that it is made up of a passive input part of an active outer part that is optically coupled to the passive part and electrically insulated from it.

In particular the passive part comprises a parallel circuit supplied with the current to be measured and including a photo-emitter diode and a photo-receiver diode that are connected in anti-parallel, whereas the active part comprises a photo-receiver transistor that is optically coupled to said photo-emitter diode of the passive part in order to form an electrically insulated current amplifier with high open-loop gain and, in series with said photo-receiver transistor, an additional photo-emitter diode optically coupled to said photo-receiver diode of the passive part in such a way so as to form an electrically insulated feedback for said amplifier and, in a symmetrical way, to an additional photo-receiver diode of the active part that produces an output signal substantially proportional to the current that flows through said photo-receiver diode of the passive part.

In other words, the current meter according to the invention is thus made up of a feedback amplifier sensitive to the current, that comprises an open-loop amplifier and a feedback, both electrically insulated. The open-loop amplifier comprises the photo-emitter diode of the passive part and the photo-receiver transistor of the active part, as well as preferably a bipolar transistor or any other circuit structure that is capable to further increase the current gain determined by the high-gain current amplifier. The feedback comprises in turn the photo-emitter diode of the active part and the photo-receiver diode of the passive part.

Even more in particular, the photo-emitter diode of the passive part and the photo-receiver transistor of the active part are implemented in the form of an optocoupler chip with high current gain at low input current, for example of the type known on the market as Toshiba TLP-127, while the photo-emitter diode of the active part and the two photo-receiver diodes are implemented in the form of a linear optocoupler chip, for example of the type known on the market as Siemens IL388 or IL300.

In this way a current meter is obtained in which the high voltage to ground present at the input affects only the passive part of the meter while the active part can be supplied with low voltage and, owing to the high gain of the current amplifier and to the symmetrical optical coupling between the photo-emitter diode of the active part and the two photo-receiver diodes, is capable to provide an output signal proportional to the current to be measured and substantially independent from the working temperature. In particular this last feature is guaranteed by the monolithic structure of the chip used used for feedback.

A current meter made in this way has proven to be particularly, though not exclusively, suitable to measure the anode current of a photomultiplier tube with earthed cathode. For such use the input part of the current meter according to the invention is connected in series with the last resistance on the anode side of the bias resistive network of the photomultiplier tube and its output together with the cathode of the photomultiplier tube is connected to an input of an operational amplifier with feedback. Due to this connection, as it will be better explained hereinafter, a voltage proportional to the anode current of the photomultiplier tube is thus produced at the output of the operational amplifier.

BRIEF DESCRIPTION OF THE DRAWINGS

The features of the present invention will be made more evident by the following detailed description of its embodiments that are illustrated as non limiting examples in the enclosed drawings, in which.

DETAILED DESCRIPTION

Figure 1:
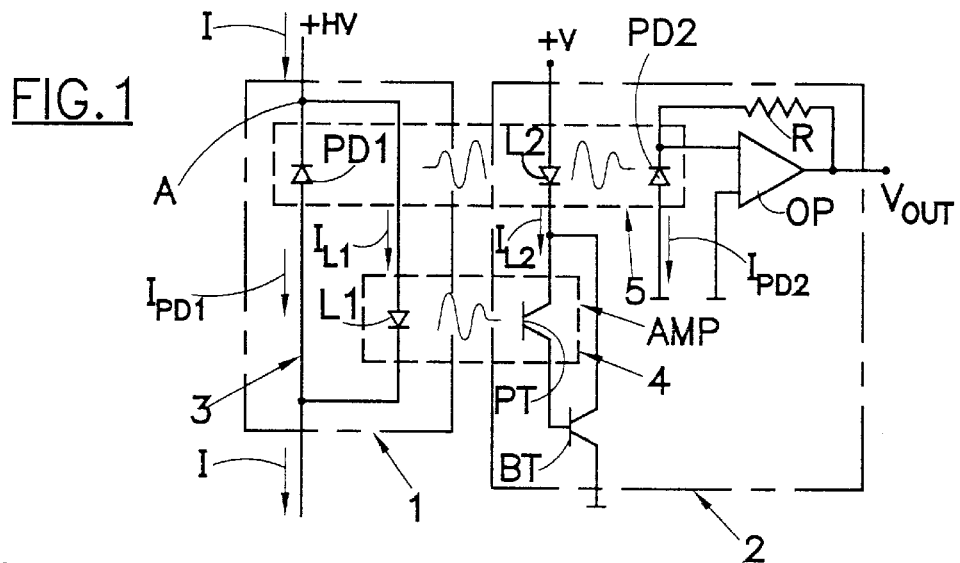
FIG. 1 shows the electric diagram of a current meter according to the present invention.

The current meter illustrated in FIG. 1 is made up of a passive input part 1 and of an active output part 2, which are optically coupled to each other and electrically insulated one from the other.

The passive part I comprises a parallel circuit 3 supplied with the current I to be measured (that flows in a conductor that can be at high voltage +HV) and includes a photo-emitter LED diode L1 and a photo-receiver diode PDI that are connected in anti-parallel.

The active part 2 comprises in turn a photo-receiver transistor PT that is optically coupled to the photo-emitter diode L1 of the passive part in such a way so as to form an electrically insulated current amplifier AMP with high open-loop gain, with which a bipolar transistor BT, possibly replaceable with an equivalent circuit structure, is associated in order to additionally increase the gain. In series with the photo-receiver transistor PT there is an additional photo-emitter LED diode L2 which is optically coupled to the photo-receiver diode PD1 of the passive part in order to form an electrically insulated feedback for the amplifier AMP and, in a symmetrical way, to an additional photo-receiver diode PD2 of the active part. In this example, the latter is set between ground and an input of an operational amplifier OP, that has another grounded input and is provided with a resistive feedback R.

The photo-emitter diode L1 of the passive part and the photo-receiver transistor PT of the active part are implemented in the form of an optocoupler chip 4 with high current gain at low input current, for example of the type known on the market as Toshiba TLP-127. The photo-emitter diode L2 of the active part and the two photo-receiver diodes PD1 and PD2 are in turn implemented in the form of a linear optocoupler chip 5, for example of the type known on the market as Siemens IL388 or IL300.

During operation, the current I to be measured enters the parallel circuit 3 through a node A, where it divides into two currents $I_{L1}$ and $I_{PD1}$. Above a threshold voltage $I_{TH}$ the following takes place: in order to establish a flow of current through the photodiode PD1 the photo-emitter diode L2 must be supplied with a current $I_{L2}=I_{PD1}/K_1$, where $K_1$ is the coupling factor of the chip 5 ($K_1 \sim 7*10^{-3}$). The current $I_{L2}$ is supplied by the amplifier AMP and, since this has a very high current gain ($A_1 \sim 0.10^4$), the current $I_{L1}=I_{L2}/A_1$ is very low. As a consequence, $I_{PD1} \sim I-I_{TH}$ and the current $I_{PD2}$ through the photodiode PD2 is linearly related to $I_{PD1}$. In fact, $I_{PD2}=K_2 I_{L2}=I_{PD1} (K_2/K_1)$, where $K_2/K_1=K_3$ is the gain of the chip 5, that in the hypothesised example is constant for a wide range of currents and not far from the unity and, what is more important for the present invention, it is virtually independent from temperature, in particular with a variation of 1.5% in a temperature range from 0° C. to 75° C.

The voltage $V_{out}$ at the output of the operational amplifier OP is thus substantially proportional to the current $I-I_{TH}$, more precisely $V_{out}=G(I-I_{TH})$, where:

$$G = K_3 * R * \frac{A_1 K_1}{1 + A_1 K_1}$$

which tends toward $K_3* R$ for $A_1 K_1$ much greater than 1.

The aforesaid operation determines a very small voltage drop at the terminals of the parallel circuit 3, equal to that of a directly biased LED diode as L1.

Figure 2:
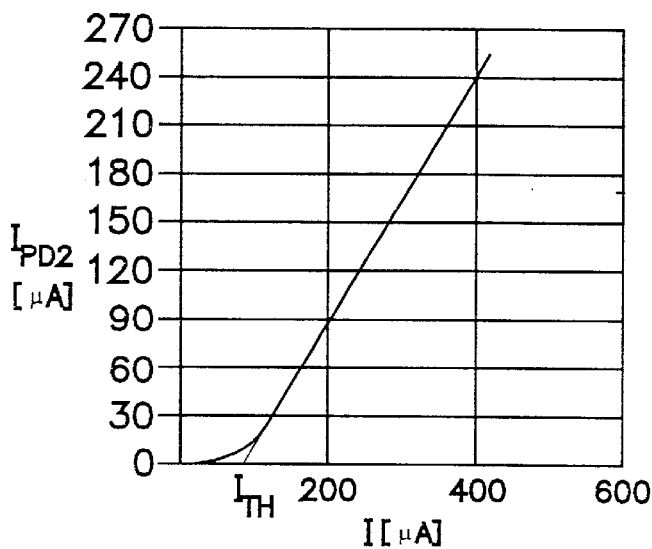
FIG. 2 shows the characteristics of input-output transfer of said current meter.

The result of this measurement is illustrated in the diagram of FIG. 2, measured in a range of temperatures from −10° C. to +50° C., that shows the input current I in abscissas and the output current $I_{PD2}$ in ordinate, both expressed in μA. An input threshold current $I_{TH}$ of around 80 μA, set by the LED L1, that requires a minimum current in order to operate is visible.

A current meter according to the present invention, in particular as rendered in FIG. 1, is particularly utilisable to measure the anode current of a photomultiplier tube with earthed cathode.

Figure 3:
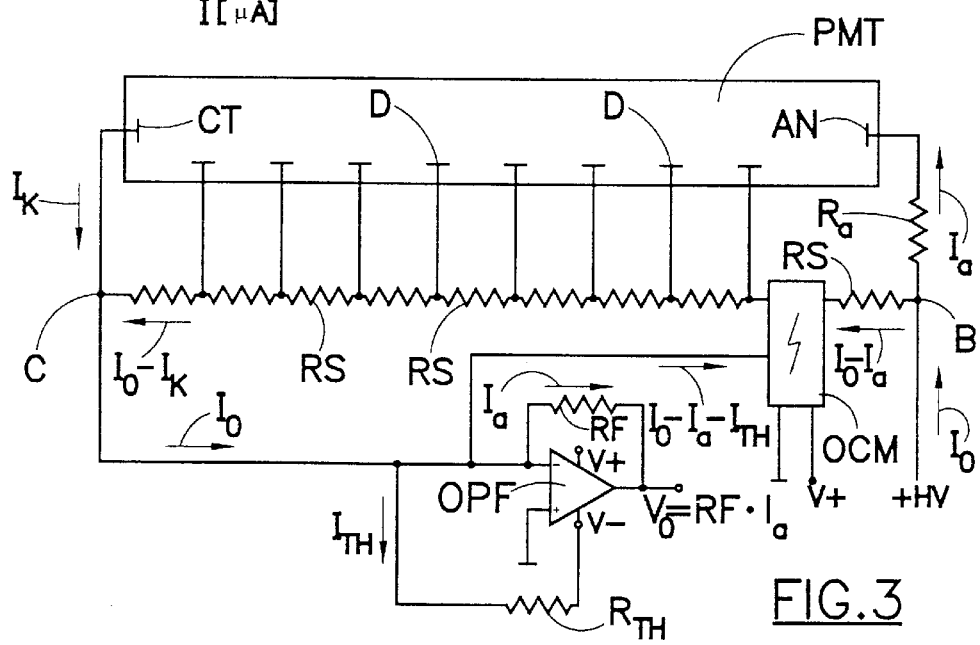
FIG. 3 shows the use of a meter according to the invention for the measurement of the anode current of a photomultiplier tube with earthed cathode.

Such use is illustrated in FIG. 3, where the photomultiplier tube is indicated by PMT, its anode by AN and its cathode by CT. The anode AN is connected with a high voltage source +HV through a resistance $R_a$. The current meter is indicated by OCM and its input part is inserted in series with the terminal resistance on the anode side of a resistive bias network of the photomultiplier tube, that is made up of a series of resistances RS that are singularly interposed between the various dynodes D of the photomultiplier tube. Its output part is instead connected with the cathode CT of the photomultiplier tube, that is also connected with an input of an operational amplifier OPF with resistive feedback RF.

During operation, in the node B the supply current $I_O$ is divided into the anode current $I_a$ and into a current $I_O-I_a$, a current that flows through the input part of the current meter OCM and then, as a consequence of the interaction of the various dynodes D and of the bias resistances RS, flows in the terminal node C in the form of current $I_O-I_K$, where $I_K$ is the cathode voltage of the photomultiplier tube.

A current $I_O$ is thus supplied at the input of the operational amplifier OPF, that is in turn divided into a current $I_{TH}$ supplied with a resistance $R_{TH}$ having a proper value, into a current $I_a$ that flows through the resistance feedback RF and into a current $I_O-I_a-I_{TH}$ that flows through the output part of the current meter OCM. At the output of the operational amplifier OPF there is thus a voltage $V_O=-G*I_a$, where RF coincides with the resistance R of FIG. 1, therefore proportional to the anode current $I_a$.

What is claimed is:

1. A direct current meter comprising:

a passive input part comprising a parallel circuit which is supplied with a current to be measured and including a photo-emitter diode and a photo-receiver diode that are connected in anti-parallel; and an active output part that is optically coupled to the passive input part and electrically insulated from the passive input part, the active output part comprising:

a photo-receiver transistor that is optically coupled to said photo-emitter diode of said passive input part in order to form an electrically insulated current amplifier; and an additional photo-emitter diode which is in series with said photo-receiver transistor and optically coupled to said photo-receiver diode of the passive part in such a way so as to form an electrically insulated feedback for said amplifier.

2. The current meter according to claim 1, wherein the active output part further comprises an additional photo-receiver diode which is optically coupled to the additional photo-emitter diode and which produces an output signal substantially proportional to the current that flows through said diode photo-receiver of the passive input part.

3. The current meter according to claim 1, wherein the diode photo-receiver of the passive input part and the additional photo-receiver diode of the active output part are symmetrically optically coupled to the additional photo-emitter diode of the active output part.

4. The current meter according to claim 1, wherein the electrically insulated current amplifier has high open-loop gain.

5. A current meter according to claim 1, wherein the photo-emitter diode of the passive input part and the photo-receiver transistor of the active output part are implemented in the form of an optocoupler chip with high current gain at low input current, whereas the photo-emitter diode of the active output part and the two photo-receiver diodes are implemented in the form of a linear optocoupler chip.

6. A current meter according to claim 1, wherein a current amplifier circuit structure is connected in series with the photo-receiver transistor.

* * * * *

UNITED STATES PATENT AND TRADEMARK OFFICE
CERTIFICATE OF CORRECTION

PATENT NO. : 6,316,930 B1
DATED : November 13, 2001
INVENTOR(S) : Camin

It is certified that error appears in the above-identified patent and that said Letters Patent is hereby corrected as shown below:

<u>Title page,</u>
Item [73] should read -- Istituto Nazionale di Fisica Nucleare, Frascati, Italy --

Signed and Sealed this

Twenty-first Day of May, 2002

Attest:

JAMES E. ROGAN
*Director of the United States Patent and Trademark Office*

*Attesting Officer*

UNITED STATES PATENT AND TRADEMARK OFFICE
CERTIFICATE OF CORRECTION

PATENT NO.    : 6,316,930 B1
DATED         : November 13, 2001
INVENTOR(S)   : Camin It is certified that error appears in the above-identified patent and that said Letters Patent is hereby corrected as shown below:

<u>Title page,</u>
Item [73], Assignee should read -- Istituto Nazionale di Fisica Nuclearo, Frascati, Italy --

Signed and Sealed this

Twenty-sixth Day of November, 2002

*Attest:*

*Attesting Officer*

JAMES E. ROGAN
*Director of the United States Patent and Trademark Office*